United States Patent
Hu (10) Patent No.: US 8,492,859 B2
(45) Date of Patent: Jul. 23, 2013

(54) MAGNETIC TUNNEL JUNCTION WITH SPACER LAYER FOR SPIN TORQUE SWITCHED MRAM

(75) Inventor: Guohan Hu, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/027,342

(22) Filed: Feb. 15, 2011

(65) Prior Publication Data

US 2012/0205759 A1 Aug. 16, 2012

(51) Int. Cl.
*H01L 29/82* (2006.01)

(52) U.S. Cl.
USPC ........ 257/421; 257/E29.323; 365/8; 365/171; 365/173

(58) Field of Classification Search
USPC .............. 257/421, E29.323; 365/8, 158, 171, 365/173
See application file for complete search history.

(56) References Cited

U.S. PATENT DOCUMENTS

| | | | |
|---|---|---|---|
| 6,166,948 A * | 12/2000 | Parkin et al. ................. | 365/173 |
| 6,845,038 B1 | 1/2005 | Shukh | |
| 7,092,284 B2 * | 8/2006 | Braun et al. ................. | 365/158 |
| 7,313,013 B2 | 12/2007 | Sun et al. | |
| 7,663,131 B2 | 2/2010 | Horng et al. | |
| 7,768,824 B2 | 8/2010 | Yoshikawa et al. | |
| 2005/0186357 A1 * | 8/2005 | Hattori et al. ................. | 427/548 |
| 2006/0204792 A1 * | 9/2006 | Osawa ................. | 428/829 |
| 2007/0278547 A1 * | 12/2007 | Pietambaram et al. ....... | 257/296 |
| 2008/0231998 A1 * | 9/2008 | Yoshikawa et al. ........... | 360/313 |
| 2008/0291585 A1 | 11/2008 | Yoshikawa et al. | |
| 2010/0039181 A1 | 2/2010 | Firastrau et al. | |
| 2010/0078741 A1 * | 4/2010 | Zheng et al. ................. | 257/421 |
| 2010/0096716 A1 * | 4/2010 | Ranjan et al. ................. | 257/421 |
| 2010/0109109 A1 * | 5/2010 | Chen et al. ................. | 257/421 |
| 2010/0178528 A1 * | 7/2010 | Tsunekawa et al. ....... | 428/811.1 |
| 2011/0062538 A1 * | 3/2011 | Rizzo et al. ................. | 257/421 |
| 2011/0064969 A1 * | 3/2011 | Chen et al. ................. | 428/800 |
| 2011/0159316 A1 * | 6/2011 | Wang et al. ................. | 428/800 |
| 2012/0063218 A1 * | 3/2012 | Huai et al. ................. | 365/171 |

OTHER PUBLICATIONS

J.H. Jung et al., "Strong perpendicular magnetic anisotrophy in thick CoFeB films sandwiched by Pd and MgO layers", Appl. Phys. Lett. 96, 042503, 2010.
K. Mizunuma et al., "MgO barrier-perpendicular magnetic tunnel junctions with CoFe/Pd multilayers and ferromagnetic insertion layers," Appl. Phys. Lett. 95, 232516, 2009.

* cited by examiner

*Primary Examiner* — William D Coleman
*Assistant Examiner* — Christine Enad
(74) *Attorney, Agent, or Firm* — Cantor Colburn LLP; Vazken Alexanian (57) ABSTRACT

A magnetic tunnel junction (MTJ) includes first and second magnetic layers; a tunnel barrier located between the first and second magnetic layers; a first spacer layer located between the first magnetic layer and the tunnel barrier, the first spacer layer comprising a non-magnetic material; and a first interfacial layer located between the first spacer layer and the tunnel barrier.

15 Claims, 6 Drawing Sheets

MAGNETIC TUNNEL JUNCTION WITH SPACER LAYER FOR SPIN TORQUE SWITCHED MRAM

BACKGROUND

This disclosure relates generally to the field of magnetoresistive random access memory (MRAM), and more specifically to spin torque switched (STT) MRAM.

MRAM is a type of solid state memory that uses tunneling magnetoresistance (TMR) to store information. MRAM is made up of an electrically connected array of magnetoresistive memory elements, referred to as magnetic tunnel junctions (MTJs). Each MTJ includes a free layer having a magnetization direction that is variable, and a fixed layer having a magnetization direction that is invariable. The free layer and fixed layer each include a layer of a magnetic material, and are separated by an insulating non-magnetic tunnel barrier. An MTJ stores information by switching the magnetization state of the free layer. When the magnetization direction of the free layer is parallel to the magnetization direction of the fixed layer, the MTJ is in a low resistance state. When the magnetization direction of the free layer is antiparallel to the magnetization direction of the fixed layer, the MTJ is in a high resistance state. The difference in resistance of the MTJ may be used to indicate a logical '1' or '0', thereby storing a bit of information. The TMR of an MTJ determines the difference in resistance between the high and low resistance states. A relatively high difference between the high and low resistance states facilitates read operations in the MRAM.

The magnetization of the free layer may be changed by a spin torque switched (STT) write method, in which a write current is applied in a direction perpendicular to the film plane of the magnetic films forming the MTJ. The write current has a tunneling magnetoresistive effect, so as to change (or reverse) the magnetization state of the free layer of the MTJ. In STT magnetization reversal, the write current required for the magnetization reversal is determined by the current density. As the area of the surface in an MTJ on which the write current flows becomes smaller, the write current required for reversing the magnetization of the free layer of the MTJ becomes smaller. Therefore, if writing is performed with fixed current density, the necessary write current becomes smaller as the MTJ size becomes smaller. MTJs that include material layers that exhibit perpendicular anisotropy (PMA) may be switched with a relatively low current density as compared to MTJs having in-plane magnetic anisotropy, which also lowers the necessary write current. However, MTJs made using PMA materials may have a relatively low TMR because of structural and chemical incompatibility between the various material layers that comprise a PMA MTJ. A relatively low TMR may result in difficulty with read operations in the STT MRAM, as the difference in resistance between the high and low resistance states of the MTJs will also be relatively low.

BRIEF SUMMARY

In one aspect, a magnetic tunnel junction (MTJ) includes first and second magnetic layers; a tunnel barrier located between the first and second magnetic layers; a first spacer layer located between the first magnetic layer and the tunnel barrier, the first spacer layer comprising a non-magnetic material; and a first interfacial layer located between the first spacer layer and the tunnel barrier.

In another aspect, a magnetic tunnel junction (MTJ) includes first and second magnetic layers; a tunnel barrier located between the first and second magnetic layers; a spacer layer comprising a non-magnetic material located within the first magnetic layer.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

Embodiments of spacer layers for a MTJ for use in STT MRAM are provided, with exemplary embodiments being discussed below in detail. The spacer layer(s) act to raise the TMR of a PMA MTJ. A spacer layer may be inserted between a free layer and an interfacial layer of an MTJ, or between a fixed layer and an interfacial layer of the MTJ, or in any other appropriate location in the MTJ in various embodiments. An MTJ may include one spacer layer or multiple spacer layers in various embodiments. A MTJ spacer layer may include a single layer of a non-magnetic material, or a relatively thin layer of a magnetic material located between two relatively thin layers of a non-magnetic material. A MTJ spacer layer may be relatively thin (e.g., 20 angstroms or less in some embodiments) to ensure a strong magnetic coupling between the interfacial layer and the free/fixed magnetic layers.

An MTJ includes a non-magnetic, insulating tunnel barrier layer located between the fixed and free magnetic layers. One or more interfacial layers may be located adjacent to the tunnel barrier, between the fixed magnetic layer and the tunnel barrier or between the free magnetic layer and the tunnel barrier. A spacer layer that is located between an interfacial layer and a free or fixed magnetic layer may promote crystallization of the interfacial layer such that the crystalline structure of the interfacial layer lattice matches the crystalline structure of the tunnel barrier, which raises the TMR of the MTJ. A PMA MTJ may include a magnesium oxide (MgO) tunnel barrier, which may have a rock salt crystalline structure. An interfacial layer in an MTJ having an MgO tunnel barrier may also have (or can crystallize into) a body-centered cubic (BCC) crystalline structure which matches the MgO tunnel barrier. An interfacial layer may include materials such as iron (Fe); cobalt (Co) and Fe containing alloys; or Co, Fe, and boron (B) containing alloys. A spacer layer may include various non-magnetic materials, including but not limited to chromium (Cr), ruthenium (Ru), titanium nitride (TiN), Ti, vanadium (V), tantalum (Ta), tantalum nitride (TaN), aluminum (Al), magnesium (Mg), or oxides such as MgO. A spacer layer may reduce or block the diffusion of TMR-degrading substances to the tunnel barrier. TMR-degrading substances, which may be present in the magnetic layers, may include but are not limited to chromium (Cr), platinum (Pt), palladium (Pd), or titanium (Ti). One or more additional spacer layers may be inserted into the MTJ at any appropriate location (in addition to the spacer layer locations discussed below with respect to FIGS. 1-5) to protect the tunnel barrier from such diffusion.

Figure 1:
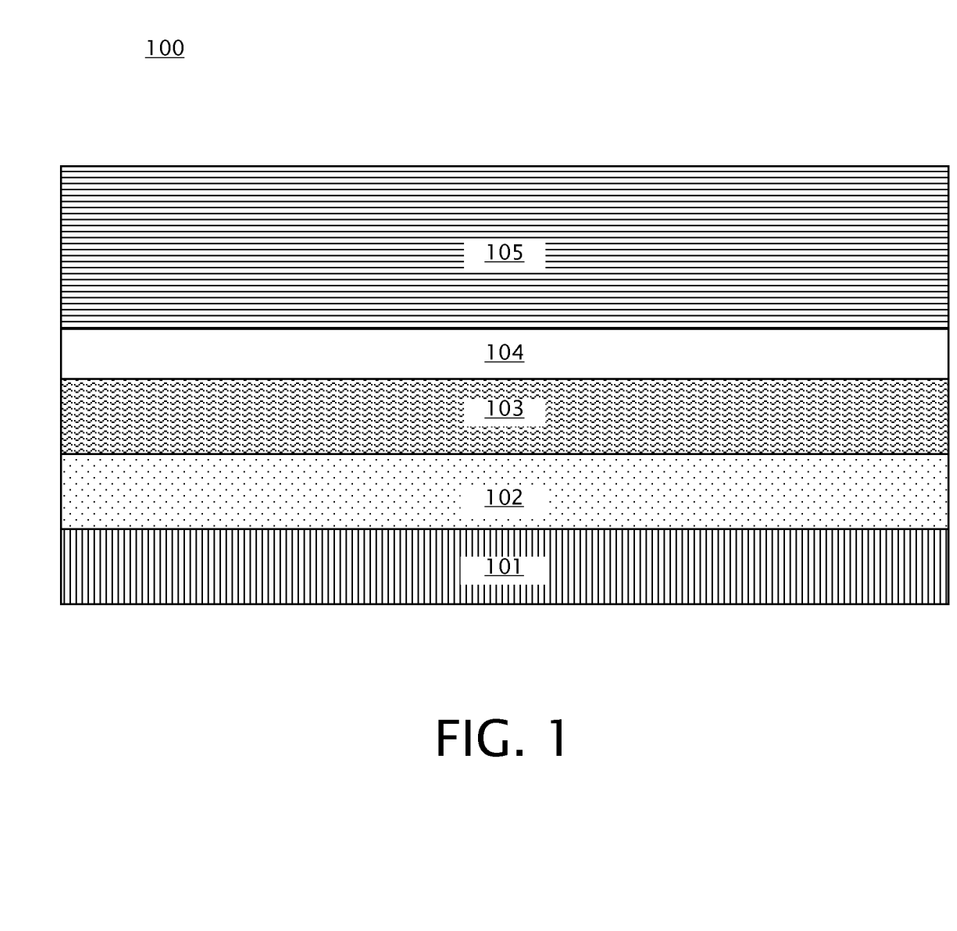
FIG. 1 is a schematic block diagram illustrating an embodiment of an MTJ with a spacer layer between an interfacial layer and a fixed magnetic layer.

FIG. 1 illustrates an embodiment of an MTJ 100 with a spacer layer 104 located between interfacial layer 103 and fixed magnetic layer 105. Free magnetic layer 101 is located underneath tunnel barrier 102, and interfacial layer 103 is located on tunnel barrier 102. Tunnel barrier 102 may include MgO, and MTJ 100 may include a PMA MTJ. The interfacial layer 103 may have, or can crystallize into, a BCC crystalline structure to match a tunnel barrier 102 that comprises MgO. The fixed magnetic layer 105 may be a single layer or a synthetic anti-ferromagnetic (SAF) layer (as discussed below with respect to FIG. 5) in some embodiments. Interfacial layer 103 may include Fe; Co and Fe containing alloys; and Co, Fe, and B containing alloys. Free magnetic layer 101 and fixed magnetic layer 105 may include multilayers of various magnetic materials, such as Co, CoFe, CoFeB, nickel (Ni), Pd, and Pt. The spacer layer 104 may include, but is not limited to non-magnetic materials such as Cr, Ru, TiN, Ti, V, Ta, TaN, Al, Mg, or oxides such as MgO. The spacer layer 104 may include a single layer of a non-magnetic material in some embodiments, or a relatively thin layer of a magnetic material located between two relatively thin layers of a non-magnetic material in other embodiments, as discussed below with respect to FIG. 6.

Figure 2:
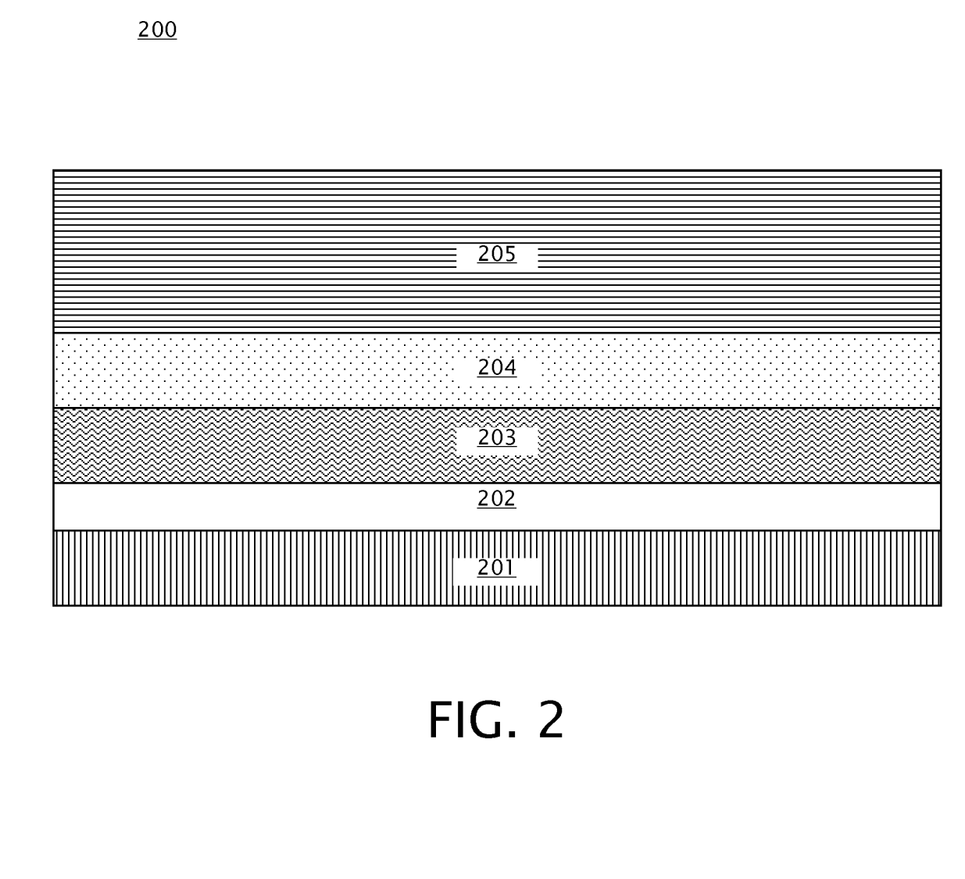
FIG. 2 is a schematic block diagram illustrating an embodiment of an MTJ with a spacer layer located between an interfacial layer and a free magnetic layer.

FIG. 2 illustrates an embodiment of a MTJ 200 with a spacer layer 202 located between free magnetic layer 201 and interfacial layer 203. Fixed magnetic layer 205 is located on top of tunnel barrier 204, and interfacial layer 203 is located on spacer layer 202. Tunnel barrier 204 may include MgO, and MTJ 200 may include a PMA MTJ. The interfacial layer 203 may have, or can crystallize into, a BCC crystalline structure to match a tunnel barrier 204 that comprises MgO. Interfacial layer 203 may include Fe; Co and Fe containing alloys; and Co, Fe, and B containing alloys. Free magnetic layer 201 and fixed magnetic layer 205 may include multilayers of various magnetic materials, such as Co, CoFe, CoFeB, Ni, Pd, and Pt. The fixed magnetic layer 205 may be a single layer or a SAF, as discussed below with respect to FIG. 5, in some embodiments. The spacer layer 202 may include, but is not limited to, non-magnetic materials such as Cr, Ru, TiN, Ti, V, Ta, TaN, Al, Mg, or oxides such as MgO. The spacer layer 202 may include a single layer of a non-magnetic material in some embodiments, or a relatively thin layer of a magnetic material located between two relatively thin layers of a non-magnetic material in other embodiments, as discussed below with respect to FIG. 6.

Figure 3:
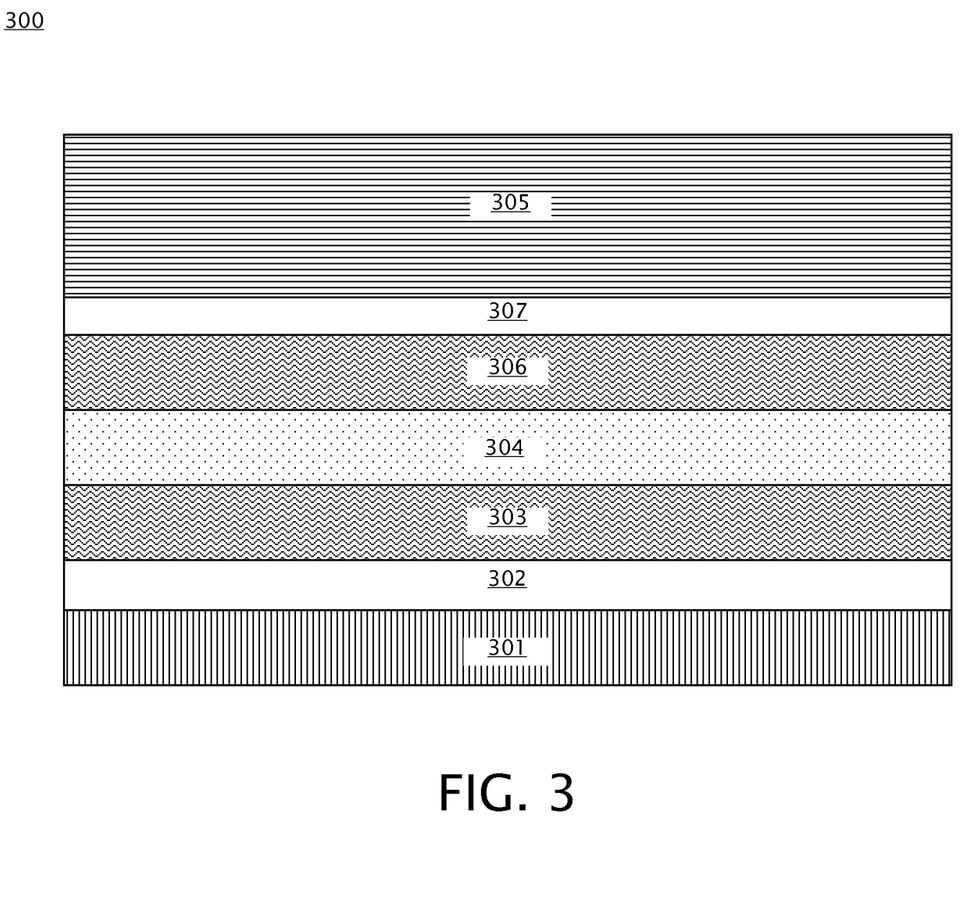
FIG. 3 is a schematic block diagram illustrating an embodiment of an MTJ with two spacer layers.

FIG. 3 illustrates an embodiment of a MTJ 300 with a spacer layer 302 located between free magnetic layer 301 and interfacial layer 303, and a spacer layer 307 located between interfacial layer 306 and fixed magnetic layer 305. Tunnel barrier 304 is located between interfacial layer 303 and interfacial layer 306. Tunnel barrier 304 may include MgO, and MTJ 300 may include a PMA MTJ. The interfacial layers 303 and 306 may have, or can crystallize into, a BCC crystalline structure to match a tunnel barrier 304 that comprises MgO. Interfacial layers 303 and 306 may include Fe; Co and Fe containing alloys; and Co, Fe, and B containing alloys. Free magnetic layer 301 and fixed magnetic layer 305 may include multilayers of various magnetic materials, such as Co, CoFe, CoFeB, Ni, Pd, and Pt. The fixed magnetic layer 305 may be a single layer or a SAF, as discussed below with respect to FIG. 5, in some embodiments. The spacer layers 302 and 307 may include, but are not limited to non-magnetic materials such as Cr, Ru, TiN, Ti, V, Ta, TaN, Al, Mg, or oxides such as MgO. The spacer layers 302 and 307 may include a single layer of a non-magnetic material in some embodiments, or a trilayer structure including a relatively thin layer of a magnetic material located between two relatively thin layers of a non-magnetic material in other embodiments, as discussed below with respect to FIG. 6.

Figure 4:
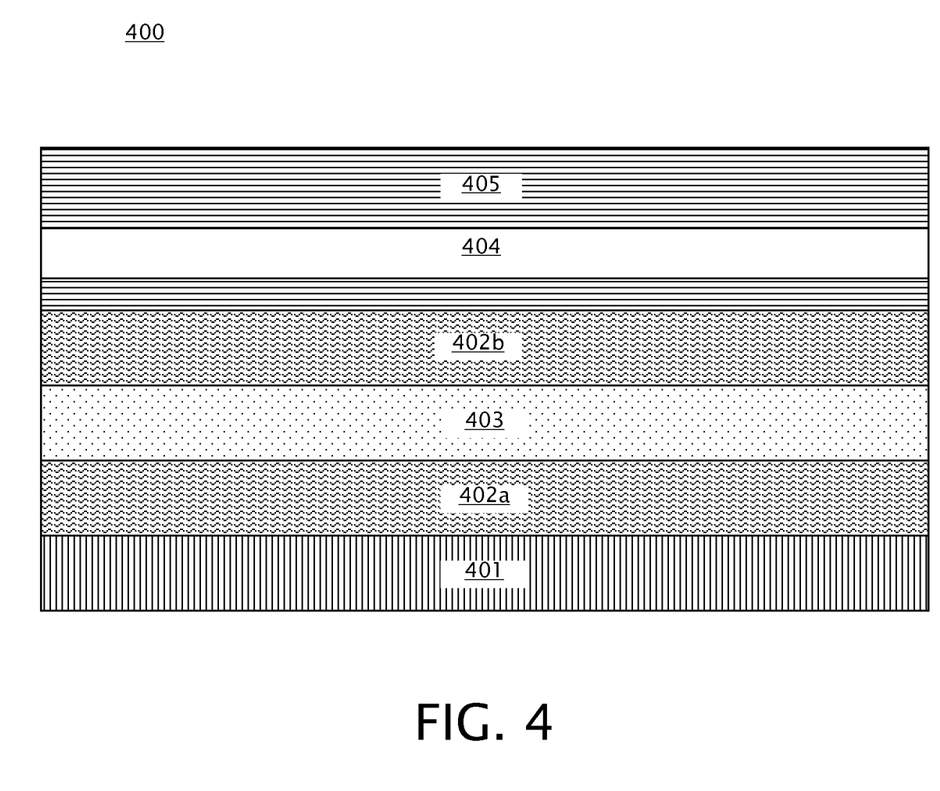
FIG. 4 is a schematic block diagram illustrating an embodiment of an MTJ with a spacer layer located within a fixed magnetic layer.

In addition to the MTJ embodiments described above with respect to FIGS. 1-3, a spacer layer may be inserted anywhere in an MTJ stack, as long as the magnetic coupling in the fixed magnetic layer and free magnetic layer is maintained. For example, a spacer layer may be inserted within a free or fixed magnetic layer of an MTJ. FIG. 4 illustrates an embodiment of an MTJ 400 with a spacer layer 404 located within the fixed magnetic layer 405. MTJ 400 also includes free magnetic layer 401, interfacial layers 402a-b, and tunnel barrier 403. Tunnel barrier 403 may include MgO, and MTJ 400 may include a PMA MTJ. Free layer 401 and fixed layer 405 may include multilayers of various magnetic materials, such as Co, CoFe, CoFeB, Ni, Pd, and Pt. The fixed magnetic layer 405 may be a single layer or a SAF, as discussed below with respect to FIG. 5, in some embodiments. The spacer layer 404 may include, but is not limited to non-magnetic materials such as Cr, Ru, TN, Ti, V, Ta, TaN, Al, Mg, or oxides such as MgO. The spacer layer 404 may include a single layer of a non-magnetic material in some embodiments, or a trilayer structure including a relatively thin layer of a magnetic material located between two relatively thin layers of a non-magnetic material in other embodiments, as discussed below with respect to FIG. 6.

Figure 5:
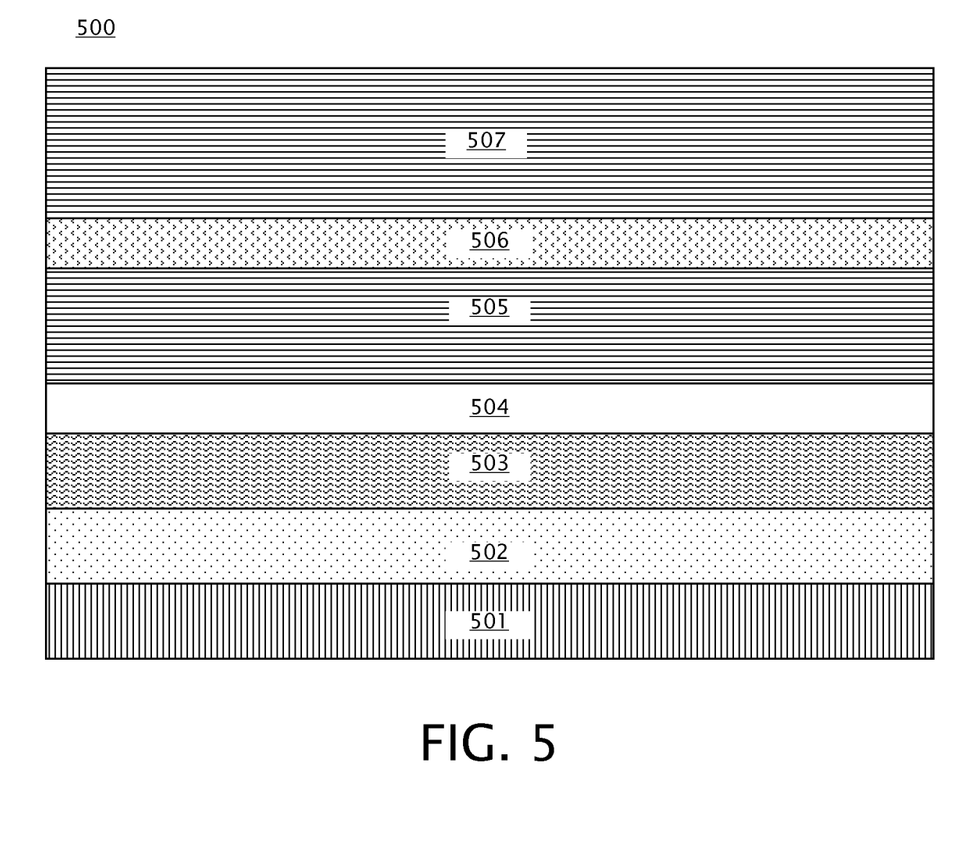
FIG. 5 is a schematic block diagram illustrating an embodiment of an MTJ with a spacer layer and a synthetic antiferromagnetic (SAF) fixed layer.

FIG. 5 illustrates an embodiment of an MTJ 500 with a spacer layer 504 located between interfacial layer 503 and an SAF fixed magnetic layer, including layers 505, 506, and 507. Free magnetic layer 501 is located underneath tunnel barrier 502, and interfacial layer 503 is located on tunnel barrier 502. Tunnel barrier 502 may include MgO, and MTJ 500 may include a PMA MTJ. The interfacial layer 503 may have, or can crystallize into, a BCC crystalline structure to match a tunnel barrier 502 that comprises MgO. The fixed SAF magnetic layer includes two magnetic layers 505 and 507 magnetically coupled through a ruthenium spacer 506. Interfacial layer 503 may include Fe; Co and Fe containing alloys; and Co, Fe, and B containing alloys. Free magnetic layer 501 and fixed magnetic layers 505/507 may include multilayers of various magnetic materials, such as Co, CoFe, CoFeB, nickel (Ni), Pd, and Pt. The spacer layer 504 may include, but is not limited to non-magnetic materials such as Cr, Ru, TiN, Ti, V, Ta, TaN, Al, Mg, or oxides such as MgO. The spacer layer 504 may include a single layer of a non-magnetic material in some embodiments, or a trilayer structure including a relatively thin layer of a magnetic material located between two relatively thin layers of a non-magnetic material in other embodiments, as discussed below with respect to FIG. 6. Spacer layer 504 in FIG. 5 is shown for illustrative purposes only; an SAF fixed magnetic layer, such as is illustrated by layers 505, 506, and 506 of FIG. 5, may be incorporated into an MTJ that includes any number of spacer layers in any appropriate location.

FIGS. 1-5 are shown for illustrative purposes only; an MTJ may have any appropriate number of interfacial layers and spacer layers, and a spacer layer may be inserted anywhere in an MTJ stack. Additional spacer layers may be inserted to block diffusion of TMR-degrading substances (such as Cr, Pt, Pd, or Ti) to the tunnel barrier from the free or fixed magnetic layers in various embodiments.

Figure 6:
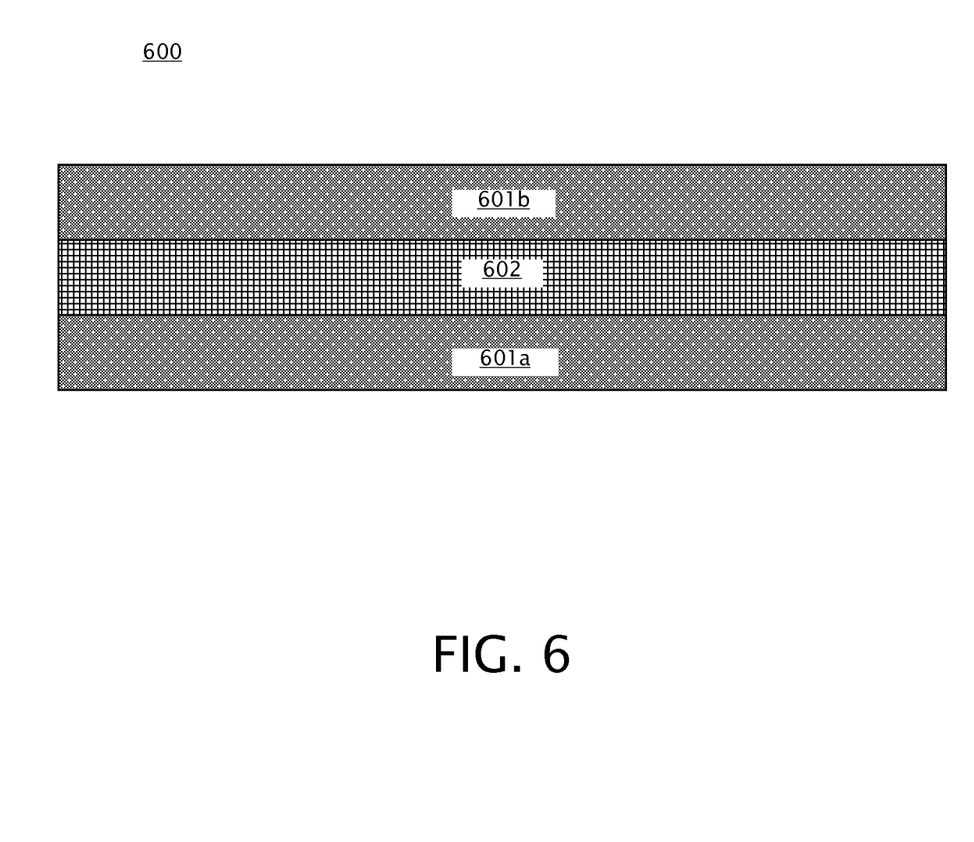
FIG. 6 is a schematic block diagram illustrating an embodiment of a trilayer spacer layer.

FIG. 6 illustrates an embodiment of a trilayer spacer layer 600. Trilayer spacer layer 600 may comprise any spacer layer in an MTJ stack, including but not limited to spacer layers 104, 202, 302, 307, 404, or 504. Magnetic layer 602 is located between non-magnetic layers 601a-b. The magnetic layer 602 may crystallize to a BCC structure in some embodiments, and may include Fe, CoFe, or CoFeB in some embodiments. Non-magnetic layers 601 a-b may include, but are not limited to Cr, Ru, TiN, Ti, V, Ta, TaN, Al, Mg, or oxides such as MgO. Trilayer spacer 600 may be 20 angstroms thick or less in some embodiments.

The technical effects and benefits of exemplary embodiments include a PMA MTJ having a relatively high TMR, through promotion of crystallization of the interfacial layer and prevention of diffusion of TMR-degrading substances to the tunnel barrier.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A magnetic tunnel junction (MTJ), comprising:
   first and second magnetic layers;
   a tunnel barrier located between the first and second magnetic layers;
   a first spacer layer located between the first magnetic layer and the tunnel barrier, the first spacer layer comprising a non-magnetic material comprising one of titanium nitride (TiN), vanadium (V), tantalum nitride (TaN), and aluminum (Al); and
   a first interfacial layer located directly adjacent to the first spacer layer and the tunnel barrier;
   wherein the first spacer layer is configured to prevent diffusion of tunneling magnetoresistive (TMR) degrading substances, including at least one of Cr, Ti, Pd, or Pt, from the first magnetic layer to the tunnel barrier;
   wherein the first spacer layer has a thickness of 20 angstroms or less and comprises first and second non-magnetic layers comprising the non-magnetic material, and a spacer magnetic layer, the spacer magnetic layer being located between and directly adjacent to each of the first and second non-magnetic layers, wherein the first non-magnetic layer is located directly adjacent to the first interfacial layer, and wherein the second non-magnetic layer is located directly adjacent to the first magnetic layer.

2. The MTJ of claim 1, further comprising:
   a second spacer layer comprising the non-magnetic material located between the second magnetic layer and the tunnel barrier; and
   a second interfacial layer located between the second spacer layer and the tunnel barrier, wherein the second interfacial layer is located directly adjacent to the second spacer layer, and wherein the first interfacial layer is located directly adjacent to the first spacer layer.

3. The MTJ of claim 1, wherein the tunnel barrier comprises magnesium oxide (MgO), and the MTJ is a perpendicular anisotropy (PMA) MTJ.

4. The MTJ of claim 1, wherein the tunnel barrier has a rock salt crystalline structure.

5. The MTJ of claim 1, wherein the first interfacial layer comprises a cobalt, iron, and boron containing alloy having a body-centered cubic (BCC) crystalline structure.

6. The MTJ of claim 1, wherein the first and second magnetic layers each comprise at least one of palladium (Pd), and platinum (Pt).

7. The MTJ of claim 1, wherein the non magnetic material comprising the first spacer layer comprises aluminum (Al).

8. The MTJ of claim 1, wherein the spacer magnetic layer comprises one of Fe, CoFe, and CoFeB.

9. The MTJ of claim 1, wherein one of the first magnetic layer and the second magnetic layer comprises a fixed magnetic layer comprising a synthetic antiferromagnetic (SAF) structure, the SAF structure comprising a ruthenium spacer located between two magnetic layers.

10. The MTJ of claim 1, wherein the non-magnetic material comprising the first spacer layer comprises vanadium (V).

11. The MTJ of claim 1, wherein the non-magnetic material comprising the first spacer layer comprises titanium nitride (TiN).

12. The MTJ of claim 1, wherein the non-magnetic material comprising the first spacer layer comprises tantalum nitride (TaN).

13. A magnetic tunnel junction (MTJ), comprising:
   first and second magnetic layers;
   a tunnel barrier located between the first and second magnetic layers;
   a spacer layer comprising a non-magnetic material located between the first magnetic layer and the tunnel barrier, the non-magnetic material comprising one of titanium nitride (TiN), vanadium (V), tantalum nitride (TaN), and aluminum (Al);
   wherein the spacer layer is configured to prevent diffusion of tunneling magnetoresistive (TMR) degrading substances, including at least one of Cr, Ti, Pd, or Pt, from the first magnetic layer to the tunnel barrier;
   wherein the spacer layer has a thickness of 20 angstroms or less and comprises first and second non-magnetic layers comprising the non-magnetic material, and a spacer magnetic layer, the spacer magnetic layer being located between the first and second non-magnetic layers, wherein the first and second non-magnetic layers are located in direct contact to the first magnetic layer.

14. The MTJ of claim 13, wherein the spacer magnetic layer comprises one of Fe, CoFe, and CoFeB.

15. The MTJ of claim 13 wherein the spacer magnetic layer is located between and directly adjacent to each of the first and second non-magnetic layers.

* * * * *